United States Patent [19]

Shimpuku et al.

[11] Patent Number: 5,781,131
[45] Date of Patent: Jul. 14, 1998

[54] DATA ENCODING METHOD AND DATA DECODING METHOD

[75] Inventors: Yoshihide Shimpuku; Toshiyuki Nakagawa. both of Kanagawa, Japan

[73] Assignee: Sony Corporation. Tokyo, Japan

[21] Appl. No.: 693,083

[22] PCT Filed: Dec. 12, 1995

[86] PCT No.: PCT/JP95/02542

§ 371 Date: Oct. 7, 1996

§ 102(e) Date: Oct. 7, 1996

[87] PCT Pub. No.: WO96/19044

PCT Pub. Date: Jun. 20, 1996

[30] Foreign Application Priority Data

Dec. 12, 1994 [JP] Japan ............... 6-306754
Sep. 5, 1995 [JP] Japan ............... 7-228391

[51] Int. Cl.$^6$ ............... H03M 5/00
[52] U.S. Cl. ............... 341/58; 341/67
[58] Field of Search ............... 341/58, 59, 102

[56] References Cited

U.S. PATENT DOCUMENTS

4,456,905  6/1984  Odaka ............... 340/347
5,355,133  10/1994  Shimpuku et al. ............... 341/58
5,400,023  3/1995  Ino et al. ............... 341/59
5,600,315  2/1997  Shimpuku et al. ............... 341/59

Primary Examiner—Howard L. Williams
Attorney, Agent, or Firm—Hill & Simpson

[57] ABSTRACT

A data encoding method for converting a (m i) bit based data word string into a (n i) bit based codeword string. The encoding method receives a (m i) bit based data word string by a shift register 1, decides a constraint length specifying the length of a data word which is to be converted by an encoder 2, and decides on which number of bits as counted from the leading end of the m bits falls the leading end bit of the data word which is to be converted. The encoding method selects, by a selector 3, one of a plurality of conversion tables constituting variable length tables and at least satisfying the minimum run length d, in accordance with the constraint length and the above results of decision. The encoding method also generates a codeword corresponding to the data word, now to be converted, in accordance with the selected conversion table. The encoding method assures a larger value of the product of the minimum length between transitions and the window margin, thus enabling data to be recorded to a higher density on an information recording medium.

32 Claims, 6 Drawing Sheets

|  | PREVIOUS CHANNEL BIT | MERGING BIT | NEXT CHANNEL BIT |  |
|---|---|---|---|---|
| FIG.5A | XXX100 | 0 | 001XX | |
| FIG.5B | XXX100 | 1 | 001XX | |
| FIG.5C | XX010 |  | 001XX | |
| FIG.5D | XX010 | 1 | 001XX | (NOT POSSIBLE) |
| FIG.5E | XX010 |  | 0001XX | ⎤ |
| FIG.5F | XX010 | 0 | 1001XX | ⎦ |
| FIG.5G | XX001 |  | 00001X | ⎤ |
| FIG.5H | XX001 | 0 | 01001X | ⎦ |
| FIG.5I | X1000 |  | 01001X | ⎤ |
| FIG.5J | X1001 | 0 | 01001X | ⎦ |

FIG.6

DATA ENCODING METHOD AND DATA DECODING METHOD

FIELD OF THE INVENTION

This invention relates to an encoding method and apparatus, a decoding method and apparatus and an information recording medium. More particularly, it relates to an encoding method and apparatus for recording data to a high density on an information recording medium, a decoding method and apparatus and the information recording medium.

BACKGROUND

In a conventional magneto-optical recording system, the signal recording characteristics are deteriorated in general in a high frequency range. This is known as the modulation transfer factor and represents the high range deterioration characteristics proper to optical recording. The magnetic recording system also suffers from such high range deterioration characteristics ascribable to e.g., a head gap.

For correct data recording/reproduction despite such loss or noise, it is more advisable to effect digital modulation suited to a particular recording system before recording the data on the recording medium since this enables stabilized storage of a larger quantity of information data. Thus it is recently practiced to encode the recording data into recording codes in accordance with a pre-set rule.

Among these recording codes is a block code. With the block code, a data string is blocked every m i bits into units termed data words which are then converted into n i channel bit codewords in accordance with a suitable code rule. If i=1, the code is a fixed length code, whereas, if i is not less than 1 and the constraint length r is not less than 1, the code is a variable length code. The block code is also termed the (d,k;m,n;r) code, where d is the minimum number of contiguous symbols "0" and k denotes the maximum number of contiguous symbols "0".

Nowadays, there is used in a magneto-optical disc device or a magnetic disc device a block code termed (2,7;1,2;4) or (2,7 RLL) code. In this block code, the minimum length between transitions Tmin=1.5 T, where T is the interval of digital data, while the window margin TW=0.5 T, with the product of the two being 0.75. In the block code, since the product of the minimum length between transitions Tmin and the window margin TW influences the recording density and the signal band, it is desirable to use larger values of Tmin and Tw.

However, in a recording medium in general and, above all, in a magneto-optical recording medium, the playback output is deteriorated significantly in the higher range such that the signal to noise ratio is diminished and hence it becomes impossible to improve the recording density and the signal band.

That is, the values of the minimum length between transitions Tmin and the window margin TW of the conventional block code known as (2.7;1,2;4) or (2.7 RLL) cannot be said to be sufficiently large values, such that it has been desired to increase these values further.

The present invention has been completed in view of the foregoing and aims at realizing recording/reproduction at a higher density.

DISCLOSURE OF THE INVENTION

In one aspect, the present invention provides a data encoding method for converting a (m i) bit based data word string into a (n i) bit based codeword string. The method includes a first step of receiving a (m i) bit based data word string, a second step of finding a constraint length specifying the length of a data word which is to be converted and which is a constituent of the (m i) bit based data word string, a third step of finding on which number of m bits, divided from the data word string as a unit, falls the leading end bit of the data word now to be converted, a fourth step of selecting one of a plurality of conversion tables constituting the variable length tables and at least satisfy the minimum run length d, in accordance with the results of decision in the third step, and a fifth step of generating a codeword corresponding to the data word, now to be converted, in accordance with the conversion table selected by the fourth step. In the encoding method of the present invention, a (m i) bit based data word string is received, and the constraint length specifying the length of a data word now to be converted is decided, while it is decided on which bit number of the m bits falls the leading end bit of the data word now to be converted. Depending on the constraint length and the results of decision, one of plural conversion tables satisfying at least the minimum run length d and each constituting a variable length table is selected. Depending on the selected conversion table, a codeword corresponding to a data word now to be converted is generated.

In another aspect, the present invention provides a data decoding method for converting a (n i) bit based codeword string into a (m i) bit based data word string. The data decoding method includes a first step of receiving a (n i) bit based codeword string, a second step of finding the conversion length of a codeword which is to be converted and which is a constituent of the (n i) bit based codeword string, a third step of deciding on which bit number of m bits, divided as a unit from the data word already obtained, falls the trailing end bit of the data word already obtained, a fourth step of selecting one of a plurality of conversion tables each constituting a variable length table in accordance with the conversion length and the results of decision in the third step, and a fifth step of generating a data word associated with the codeword, now to be converted, in accordance with the conversion table selected in the fourth step. The codeword string satisfies at least the rule of the minimum run-length d. With the data decoding method, the (n i) bit based codeword string is received, the conversion length specifying the length of the codeword now to be converted is decided, while it is also decided on which bit number falls the trailing bit of the data word already obtained. Depending on the conversion length and the results of decision, one of the plural conversion tables each constituting a variable length table is selected by each conversion table, and the data word corresponding to the codeword now to be converted is generated.

EMBODIMENT

Figure 1:
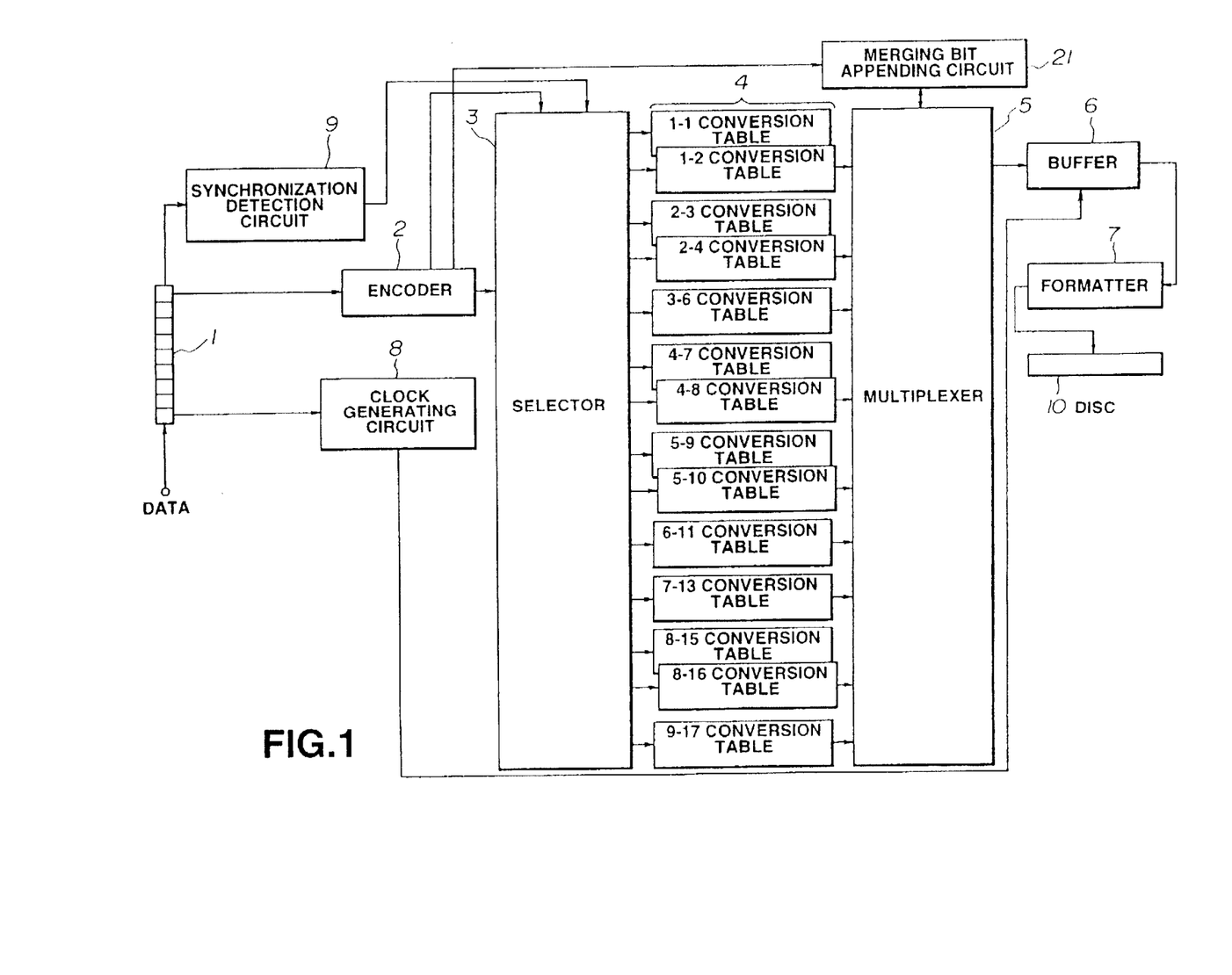
FIG. 1 is a schematic block diagram showing an arrangement of an encoder embodying the present invention.
Figures 2A, 2B, 2C:
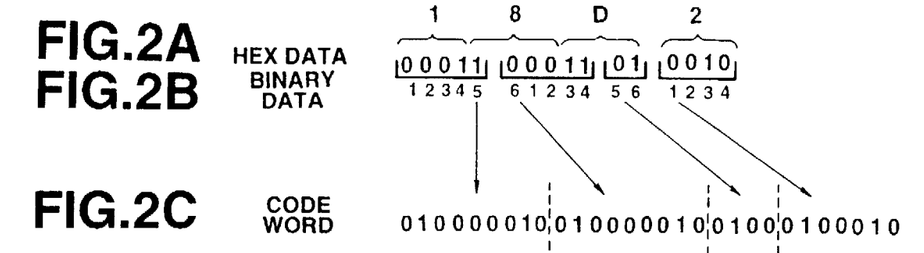
FIGS. 2A, 2B, 2C, 2D, 2E and 2F illustrate the operation of the encoder shown in FIG. 1.
Figure 2D:
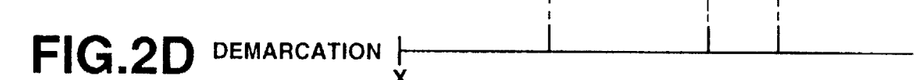
Figure 2E:
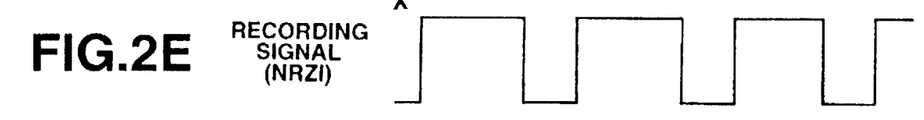
Figure 2F:
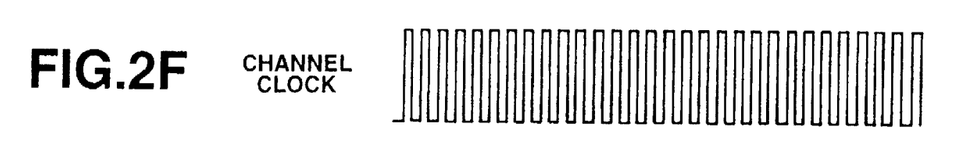
Figure 3:
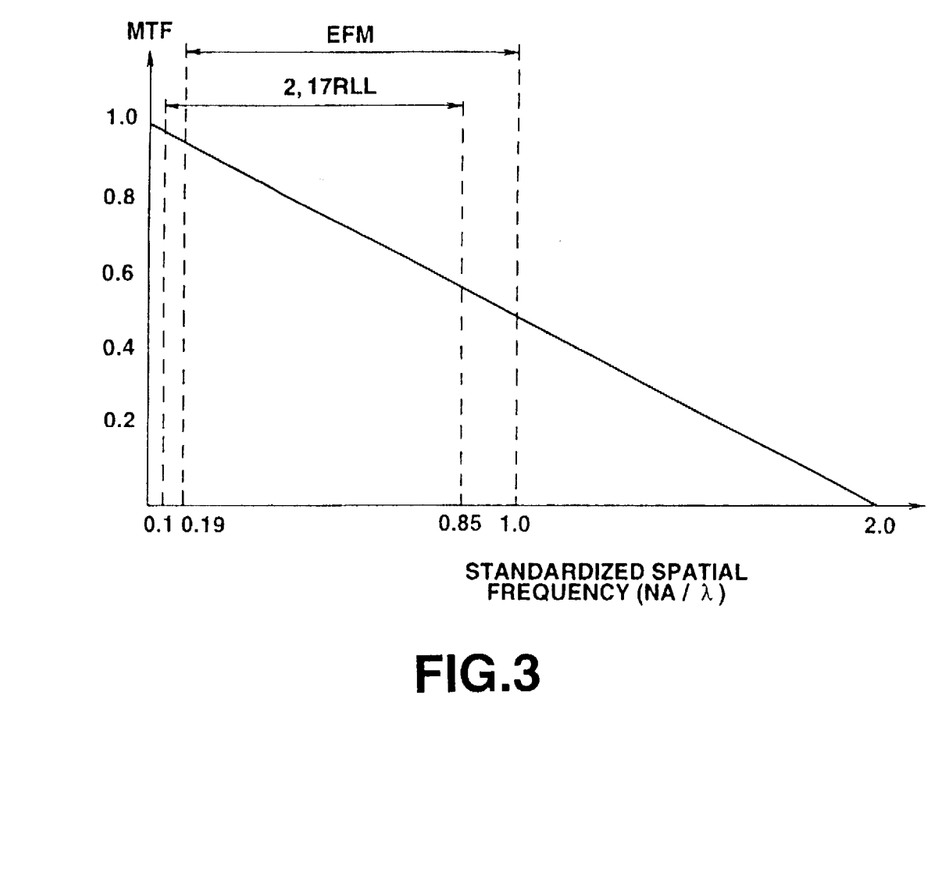
FIG. 3 is a graph showing the relation between the MTF of the code in the encoder of FIG. 1 and the normalized spatial frequency.
Figure 4:
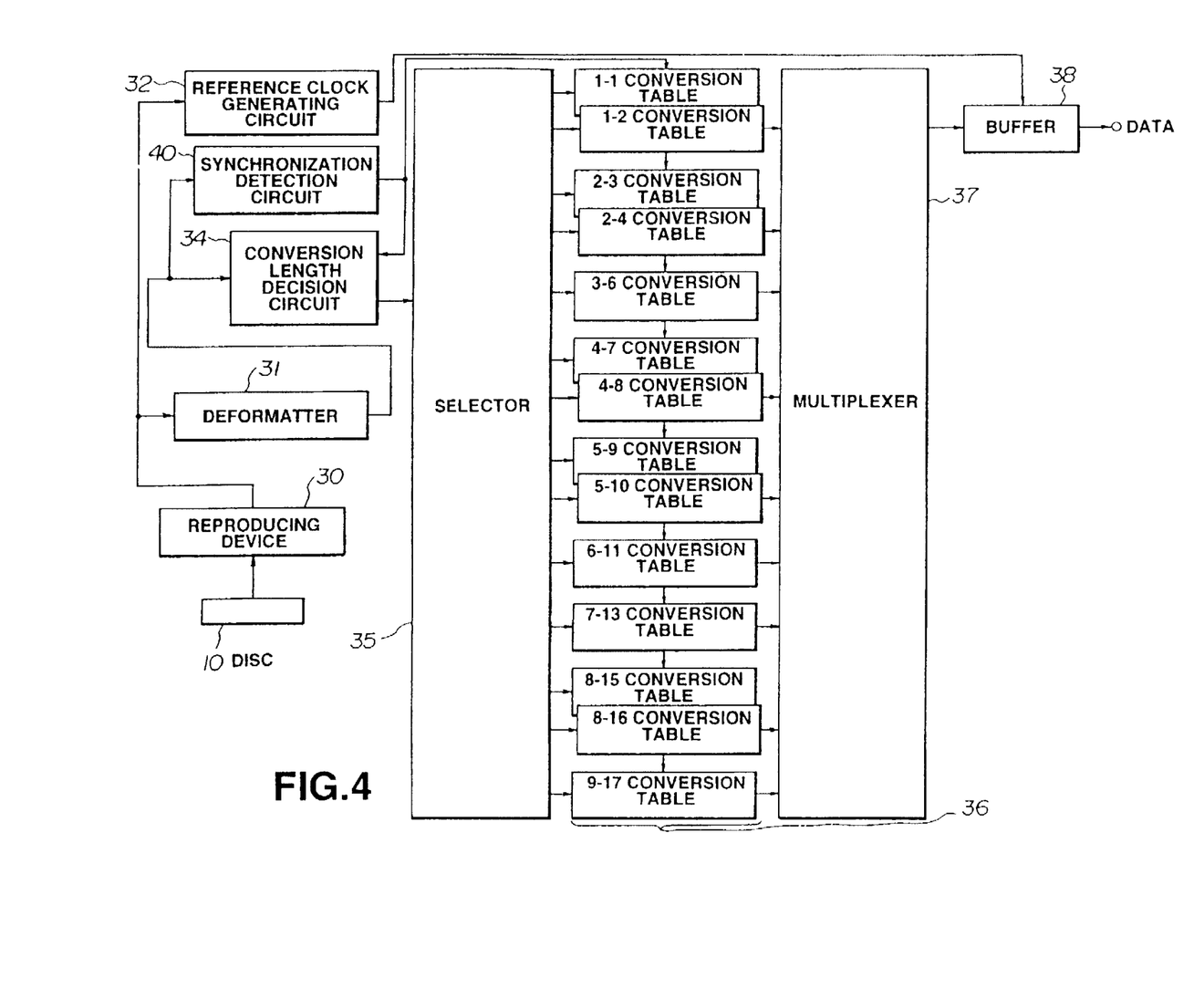
FIG. 4 is a schematic block diagram showing an arrangement of a decoder for decoding the data encoded by the encoder of FIG. 1.

An illustrative embodiment of the present invention is shown in FIGS. 1 to 4, wherein FIG. 1 is a block diagram showing an arrangement of an encoder embodying the present invention. FIG. 2 illustrates the operation of the encoder shown in FIG. 1. FIG. 3 is a graph showing the relation between the MTF of the (2.17) code in the encoder of FIG. 1 and the standardization spatial frequency. FIG. 4 is a schematic block diagram showing an arrangement of a decoder for decoding the data encoded by the encoder of FIG. 1.

The embodiment shown in FIG. 1 is an encoder for encoding digital data into the (2,15;6,11) code. The information is recorded on an information recording medium based upon encoded codewords.

The (2,15;6,11) code is first explained. The (2,15;6,11) code encodes input 6-bit data into a 11-bit codeword.

The 6-bit input data can be connected on the bit basis. In general, plural different sorts of conversion tables are repeatedly used in the bit sequence of the input data for encoding into 11 bits.

If the constraint length r is sequentially increased from 1 through to 9, the numbers of codes required for bit-by-bit increase are 2, 4, 6, 8, 10, 12, 14, 16 and 18 or 1, 3, 5, 7, 9, 11, 13, 15 and 17. Thus, in effect, six sorts of the conversion tables are required from one constraint length to another. However, if the voluminous conversion tables are repeatedly used for encoding, the conversion efficiency is undesirably lowered. Thus, in the instant embodiment, six sorts of the conversion tables, associated with input data strings with constraint lengths r of from 7 to 9, are used, and original digital data is converted into codewords without deficit or surplus for thereby increasing the conversion efficiency.

TABLE 1

| 2-15 RLL Data | 1 2 3 4 5 6 1 2 3 2 Codeword | |
|---|---|---|
| 1 | 0 | 1-1 conversion table |
| 01 | 0 10 | 2-3 conversion table |
| 0011 | 0 00 00 10 | 4-7 conversion table |
| 0010 | 0 10 00 10 | 4-7 conversion table |
| 00011 | 0 00 10 00 10 | 5-9 conversion table |
| 00010 | 0 10 00 00 10 | 5-9 conversion table |
| 000011 | 0 10 00 00 00 10 | 6-11 conversion table |
| 000010 | 0 10 00 10 00 10 | 6-11 conversion table |
| 000001 | 0 00 10 00 00 10 | 6-11 conversion table |
| 111111 | 0 00 00 10 00 10 | 6-11 conversion table |
| 00000011 | 0 10 00 00 10 00 1 00 | 8-14 conversion table |
| 00000010 | 0 00 10 00 10 00 1 00 | 8-14 conversion table |
| 00000001 | 0 10 00 00 10 00 1 00 | 8-14 conversion table |
| 000000001 | 0 10 00 00 00 10 0 00 10 | 9-16 conversion table |
| 000000000 | 0 10 00 10 00 10 0 00 10 | 9-16 conversion table |

TABLE 1-2

| Data | 2 3 4 5 6 1 2 3 Codeword | |
|---|---|---|
| 1 | 00 | 1-2 conversion table |
| 01 | 01 00 | 2-4 conversion table |
| 001 | 01 00 10 | 3-6 conversion table |
| 0001 | 01 00 00 10 | 4-8 conversion table |
| 00001 | 01 00 00 00 10 | 5-10 conversion table |
| 00000 | 01 00 10 00 10 | 5-10 conversion table |
| 1111111 | 01 00 00 10 00 1 00 | 7-13 conversion table |

TABLE 1-3

| Data | 3 4 5 6 1 2 3 4 Codeword | |
|---|---|---|
| 1 | 00 | 1-2 conversion table |
| 01 | 01 00 | 2-4 conversion table |
| 001 | 01 00 10 | 3-6 conversion table |
| 0001 | 01 00 00 10 | 4-8 conversion table |
| 000011 | 01 00 10 00 1 00 | 6-11 conversion table |
| 000010 | 00 10 00 00 1 00 | 6-11 conversion table |
| 0000011 | 01 00 00 00 0 00 10 | 7-13 conversion table |
| 0000010 | 01 00 10 00 0 00 10 | 7-13 conversion table |
| 0000001 | 00 10 00 10 0 00 10 | 7-13 conversion table |
| 0000000 | 00 10 00 00 0 00 10 | 7-13 conversion table |
| 1111111 | 01 00 00 10 0 00 10 | 7-13 conversion table |

TABLE 1-4

| Data | 4 5 6 1 2 3 4 5 6 Codeword | |
|---|---|---|
| 1 | 00 | 1-2 conversion table |
| 01 | 01 00 | 2-4 conversion table |
| 001 | 01 00 10 | 3-6 conversion table |
| 00011 | 01 00 00 1 00 | 5-9 conversion table |
| 000101 | 01 00 00 0 00 10 | 6-11 conversion table |
| 000100 | 01 00 10 0 00 10 | 6-11 conversion table |
| 000011 | 00 10 00 0 00 10 | 6-11 conversion table |
| 000010 | 00 00 10 0 00 10 | 6-11 conversion table |
| 111111 | 00 10 00 1 00 10 | 6-11 conversion table |
| 0000011 | 01 00 00 1 00 00 10 | 7-13 conversion table |
| 0000010 | 00 10 00 1 00 00 10 | 7-13 conversion table |
| 00000011 | 01 00 00 0 00 00 00 10 | 8-15 conversion table |
| 00000010 | 01 00 10 0 00 00 00 10 | 8-15 conversion table |
| 00000001 | 01 00 00 0 00 00 00 10 | 8-15 conversion table |
| 00000000 | 00 10 00 0 00 00 00 10 | 8-15 conversion table |

TABLE 1-5

| Data | 5 6 1 2 3 4 5 6 1 Codeword | |
|---|---|---|
| 1 | 00 | 1-2 conversion table |
| 01 | 01 00 | 2-4 conversion table |
| 0011 | 01 00 1 00 | 4-7 conversion table |
| 0010 | 00 00 1 00 | 4-7 conversion table |
| 00011 | 01 00 0 00 10 | 5-9 conversion table |
| 00010 | 01 00 0 00 10 | 5-9 conversion table |
| 000011 | 01 00 1 00 00 10 | 6-11 conversion table |
| 111111 | 00 00 1 00 00 10 | 6-11 conversion table |
| 0000101 | 01 00 1 00 00 00 10 | 7-13 conversion table |
| 0000100 | 01 00 0 00 00 00 10 | 7-13 conversion table |
| 0000011 | 01 00 1 00 10 00 10 | 7-13 conversion table |
| 0000010 | 00 10 0 00 10 00 10 | 7-13 conversion table |
| 00000011 | 01 00 1 00 00 00 00 10 | 8-15 conversion table |
| 00000010 | 01 00 0 00 00 00 00 10 | 8-15 conversion table |
| 00000001 | 00 00 1 00 00 00 00 10 | 8-15 conversion table |
| 00000000 | 00 00 1 00 10 00 00 10 | 8-15 conversion table |

TABLE 1-6

| Data | 6 1 2 3 4 5 6 1 Codeword | |
|---|---|---|
| 1 | 00 | 1-2 conversion table |
| 01 | 01 0 | 2-3 conversion table |
| 0011 | 01 0 00 10 | 4-7 conversion table |
| 0010 | 00 1 00 10 | 4-7 conversion table |
| 00011 | 01 0 00 00 10 | 5-9 conversion table |
| 000101 | 01 0 00 00 00 10 | 6-11 conversion table |
| 000100 | 01 0 00 10 00 10 | 6-11 conversion table |
| 000011 | 00 1 00 10 00 10 | 6-11 conversion table |
| 000010 | 00 1 00 00 00 10 | 6-11 conversion table |

TABLE 1-6-continued

| Data | 6 1 2 3 4 5 6 1<br>Codeword | |
|---|---|---|
| 0000011 | 01 0 00 00 00 00 10 | 7-13 conversion table |
| 0000010 | 01 0 00 10 00 00 10 | 7-13 conversion table |
| 0000001 | 01 0 00 00 10 00 10 | 7-13 conversion table |
| 0000000 | 00 1 00 10 00 00 10 | 7-13 conversion table |
| 1111111 | 00 1 00 00 00 00 10 | 7-13 conversion table |
| 1111110 | 00 1 00 00 10 00 10 | 7-13 conversion table |

TABLE 2-1

| Destination<br>Data | 1 2 3 4 5 6 1 2 3<br>Codeword | Storage |
|---|---|---|
| 1 | 0 | 1-1 conversion table |
| 01 | 0 10 | 2-3 conversion table |
| 0011 | 0 00 00 10 | 4-7 conversion table |
| 0010 | 0 10 00 10 | 4-7 conversion table |
| 00011 | 0 10 00 00 10 | 5-9 conversion table |
| 00010 | 0 00 10 00 10 | 5-9 conversion table |
| 000011 | 0 10 00 00 00 10 | 6-11 conversion table |
| 000010 | 0 10 00 10 00 10 | 6-11 conversion table |
| 000001 | 0 00 10 00 00 10 | 6-11 conversion table |
| 000000 | 0 00 00 10 00 10 | 6-11 conversion table |
| 11111111 | 0 10 00 00 10 00 1 00 | 8-14 conversion table |
| 11111110 | 0 00 10 00 10 00 1 00 | 8-14 conversion table |

TABLE 2-2

| Data | 2 3 4 5 6 1 2 3<br>Codeword | Storage Destination |
|---|---|---|
| 1 | 00 | 1-2 conversion table |
| 01 | 01 00 | 2-4 conversion table |
| 001 | 01 00 10 | 3-6 conversion table |
| 0001 | 01 00 00 10 | 4-8 conversion table |
| 00001 | 01 00 00 00 10 | 5-10 conversion table |
| 00000 | 01 00 10 00 10 | 5-10 conversion table |
| 1111111 | 01 00 00 10 00 1 00 | 7-13 conversion table |

TABLE 2-3

| Data | 3 4 5 6 1 2 3 4 5 6<br>Codewords | Storage Destination |
|---|---|---|
| 1 | 00 | 1-2 conversion table |
| 01 | 01 00 | 2-4 conversion table |
| 001 | 01 00 10 | 3-6 conversion table |
| 0001 | 01 00 00 10 | 4-8 conversion table |
| 000011 | 01 00 10 00 1 00 | 6-11 conversion table |
| 0000101 | 01 00 00 00 0 00 10 | 7-13 conversion table |
| 0000100 | 01 00 10 00 0 00 10 | 7-13 conversion table |
| 0000011 | 00 10 00 10 0 00 10 | 7-13 conversion table |
| 0000010 | 00 10 00 00 0 00 10 | 7-13 conversion table |
| 1111111 | 01 00 00 10 0 00 10 | 7-13 conversion table |
| 00000011 | 01 00 10 00 1 00 00 10 | 8-15 conversion table |
| 00000010 | 01 00 00 00 1 00 00 10 | 8-15 conversion table |
| 00000001 | 00 00 10 00 1 00 00 10 | 8-15 conversion table |
| 000000001 | 01 00 00 00 0 00 00 00 10 | 9-17 conversion table |
| 000000000 | 01 00 10 00 1 00 00 00 10 | 9-17 conversion table |

TABLE 2-4

| | 4 5 6 1 2 3 4 5 6 | Storage Destination |
|---|---|---|
| 1 | 00 | 1-2 conversion table |
| 01 | 01 00 | 2-4 conversion table |
| 001 | 01 00 10 | 3-6 conversion table |
| 00011 | 01 00 00 1 00 | 5-9 conversion table |

TABLE 2-4-continued

| | 4 5 6 1 2 3 4 5 6 | Storage Destination |
|---|---|---|
| 000101 | 01 00 00 0 00 10 | 6-11 conversion table |
| 000100 | 01 00 10 0 00 10 | 6-11 conversion table |
| 000011 | 00 10 00 0 00 10 | 6-11 conversion table |
| 000010 | 0 00 10 0 00 10 | 6-11 conversion table |
| 0000011 | 01 00 00 1 00 00 10 | 7-13 conversion table |
| 0000010 | 00 10 00 1 00 00 10 | 7-13 conversion table |
| 00000011 | 01 00 00 0 00 00 00 10 | 8-15 conversion table |
| 00000010 | 01 00 10 0 00 00 00 10 | 8-15 conversion table |
| 00000001 | 01 00 00 0 00 00 00 10 | 8-15 conversion table |
| 00000000 | 00 10 00 0 00 00 00 10 | 8-15 conversion table |

TABLE 2-5

| | 5 6 1 2 3 4 5 6 1 | Storage Destination |
|---|---|---|
| 1 | 00 | 1-2 conversion table |
| 01 | 01 00 | 2-4 conversion table |
| 0011 | 01 00 1 00 | 4-7 conversion table |
| 0010 | 00 00 1 00 | 4-7 conversion table |
| 00011 | 01 00 1 00 10 | 5-9 conversion table |
| 00010 | 01 00 0 00 10 | 5-9 conversion table |
| 000011 | 01 00 1 00 00 10 | 6-11 conversion table |
| 111111 | 00 00 1 00 00 10 | 6-11 conversion table |
| 0000101 | 01 00 1 00 00 00 10 | 7-13 conversion table |
| 0000100 | 01 00 0 00 00 00 10 | 7-13 conversion table |
| 0000011 | 01 00 1 00 10 00 10 | 7-13 conversion table |
| 0000010 | 00 10 0 00 10 00 10 | 7-13 conversion table |
| 00000011 | 01 00 1 00 00 00 00 10 | 8-15 conversion table |
| 00000010 | 01 00 0 00 00 00 00 10 | 8-15 conversion table |
| 00000001 | 00 00 1 00 00 00 00 10 | 8-15 conversion table |
| 00000000 | 00 00 1 00 10 00 00 10 | 8-15 conversion table |

TABLE 2-6

| Data | 6 1 2 3 4 5 6 1<br>Codeword | Storage Destination |
|---|---|---|
| 1 | 00 | 1-2 conversion table |
| 01 | 01 0 | 2-3 conversion table |
| 0011 | 01 0 00 10 | 4-7 conversion table |
| 0010 | 00 1 00 10 | 4-7 conversion table |
| 00011 | 01 0 00 00 10 | 5-9 conversion table |
| 000101 | 01 0 00 00 00 10 | 6-11 conversion table |
| 000100 | 01 0 00 10 00 10 | 6-11 conversion table |
| 000011 | 00 1 00 10 00 10 | 6-11 conversion table |
| 000010 | 00 1 00 00 00 10 | 6-11 conversion table |
| 0000011 | 01 0 00 00 00 00 10 | 7-13 conversion table |
| 0000010 | 01 0 00 10 00 00 10 | 7-13 conversion table |
| 0000001 | 01 0 00 00 10 00 10 | 7-13 conversion table |
| 0000000 | 00 1 00 10 00 00 10 | 7-13 conversion table |
| 1111111 | 00 1 00 00 00 00 10 | 7-13 conversion table |
| 1111110 | 00 1 00 00 10 00 10 | 7-13 conversion table |

In the above Tables, the numerals entered directly above the codewords indicate the sequence of the table to be used next.

Table 1-1 is a conversion table, for the case in which the first bit of the data is the first bit of 6-bit data as a conversion unit, with the maximum constraint length r=9. Table 1-2 is a conversion table, for the case in which the first bit of the data is the second bit of 6-bit data as a conversion unit, with the maximum constraint length r=7. Table 1-3 is a conversion table, for the case in which the first bit of the data is the third bit of 6-bit data as a conversion unit, with the maximum constraint length r=7. Table 1-4 is a conversion table, for the case in which the first bit of the data is the fourth bit of 6-bit data as a conversion unit, with the maximum constraint length r=8. Table 1-5 is a conversion table, for the case in which the first bit of the data is the fifth bit of 6-bit data as a conversion unit, with the maximum constraint length r=8. Table 1-6 is a conversion table, for the case in which the first bit of the data is the sixth bit of 6-bit data as a conversion unit, with the maximum constraint length r=7.

On the other hand, Table 2-1 is a conversion table, for the case in which the first bit of the data is the first bit of 6-bit data as a conversion unit, with the maximum constraint length r=8. Table 2-2 is a conversion table, for the case in which the first bit of the data is the second bit of 6-bit data as a conversion unit, with the maximum constraint length r=7. Table 2-3 is a conversion table, for the case in which the first bit of the data is the third bit of 6-bit data as a conversion unit, with the maximum constraint length r=9. Table 2-4 is a conversion table, for the case in which the first bit of the data is the fourth bit of 6-bit data as a conversion unit, with the maximum constraint length r=8. Table 2-5 is a conversion table, for the case in which the first bit of the data is the fifth bit of 6-bit data as a conversion unit, with the maximum constraint length r=8. Table 2-6 is a conversion table, for the case in which the first bit of the data is the sixth bit of 6-bit data as a conversion unit, with the maximum constraint length r=7. In sum, in the Tables 1-1 to 1-6 and Tables 2-1 to 2-6, the number of the table to be used next is found by (the total number of bits up to now)/ 6+1.

In Tables 1-1 to 1-6 and Tables 2-1 to 2-6, the code for the input digital data "1", that is the code for the constraint length r=1, is "0" or "00". Thus, if digital data is a bit string of consecutive "1"s, the symbol "0" as the codeword is consecutive infinitely. Thus it may be feared that self-clocks may be detected difficultly. However, if the digital data is a bit string with more than 6 consecutive "1"s, it is converted into a codestring having "1" partway, as shown in Tables 1-1 to 1-6 and 2-1 to 2-6. The manner of modulation in such case is as follows: If the leading end of the data word to be converted is the logical "1", it is judged how many logical "1"s appear consecutively. If six or more logical "1"s appear consecutively, the conversion operation is controlled so that such data word will be converted into special codewords specified in the tables.

The last two or three bits of the codestring with the constraint length r=2 ff. become "10" or "111". Thus, "10" and "100" basically specify the terminal end of the code. If these codes are used repeatedly, one-for-one conversion becomes possible without surplus or deficit in the number of codes. This means that the codes resulting from conversion can be uniquely demodulated into data.

The rank (rnk), the number of required codes N, the number of actual codes M and the number of residual codes D for the basic code (m, n) in Tables 2-1 to 2-6 are shown in Tables 3-1 to 3-6.

By way of verification, reference is had to Table 3-1. Since 1-1 conversion is used for 1-bit data, only the codeword "0" may be used a the actual code if limitation of d=2 (RLL) is taken into account. Thus, for 1-1 conversion, that is basic code (1,1), the number of codes N required for representing the data in their entirety is 2 (0 and 1) and the number of actually usable codes M is 1 (only 0), with the residual number of codes D being 1 (2−1). If the rank rnk is increased, D=0 for rnk =5. Thus it is seen that Table 1 is closed without surplus or deficit in the number of codes. In Tables 3, * is intended for prohibiting Tmax from being increased infinitesimally.

TABLE 3-1

| Basic Code | rnk | N | M | D |
|---|---|---|---|---|
| (1,1) | 1 | 2 | 1 | 1 |
| (1,2) | 2 | 2 | 1 | 1 |
| (2,4) | 3 | 4 | 2 | 2 |
| (1,2) | 4 | 4 | 2 | 2 |
| (1,2) | 5 | 4 | 4 | 0 |
| * | 7 | 2 | 2 | 0 |

TABLE 3-2

| Basic Code | rnk | N | M | D |
|---|---|---|---|---|
| (1,2) | 1 | 2 | 1 | 1 |
| (1,2) | 2 | 2 | 1 | 1 |
| (1,2) | 3 | 2 | 1 | 1 |
| (1,2) | 4 | 2 | 1 | 1 |
| (1,2) | 5 | 2 | 2 | 0 |
| * | 7 | 1 | 1 | 0 |

TABLE 3-3

| Basic Code | rnk | N | M | D |
|---|---|---|---|---|
| (1,2) | 1 | 2 | 1 | 1 |
| (1,2) | 2 | 2 | 1 | 1 |
| (1,2) | 3 | 2 | 1 | 1 |
| (1,2) | 4 | 2 | 1 | 1 |
| (2,3) | 5 | 4 | 1 | 3 |
| (1,2) | 6 | 6 | 4 | 2 |
| (1,2) | 7 | 4 | 3 | 1 |
| (1,2) | 8 | 2 | 2 | 0 |
| * | 6 | 1 | 1 | 0 |

TABLE 3-4

| Basic Code | rnk | N | M | D |
|---|---|---|---|---|
| (1,2) | 1 | 2 | 1 | 1 |
| (1,2) | 2 | 2 | 1 | 1 |
| (1,2) | 3 | 2 | 1 | 1 |
| (2,3) | 4 | 4 | 1 | 3 |
| (1,2) | 5 | 6 | 4 | 2 |
| (1,2) | 6 | 4 | 2 | 2 |
| (1,2) | 7 | 4 | 4 | 0 |

TABLE 3-5

| Basic Code | rnk | N | M | D |
|---|---|---|---|---|
| (1,2) | 1 | 2 | 1 | 1 |
| (1,2) | 2 | 2 | 1 | 1 |
| (1,1) | 3 | 4 | 2 | 2 |
| (1,2) | 4 | 4 | 2 | 2 |
| (1,2) | 5 | 4 | 1 | 1 |
| * | 5 | 1 | 1 | 0 |
| (1,2) | 6 | 6 | 4 | 2 |
| (1,2) | 7 | 4 | 4 | 0 |

TABLE 3-6

| Basic Code | rnk | N | M | D |
|---|---|---|---|---|
| (1,2) | 1 | 2 | 1 | 1 |
| (1,2) | 2 | 2 | 1 | 1 |
| (2,3) | 3 | 4 | 2 | 2 |
| (1,2) | 4 | 4 | 1 | 3 |

TABLE 3-6-continued

| Basic Code | mk | N | M | D |
|---|---|---|---|---|
| (1,2) | 5 | 6 | 4 | 2 |
| (1,2) | 6 | 4 | 4 | 0 |
| * | 6 | 2 | 2 | 0 |

The encoding device for carrying out the above encoding using the conversion tables of Tables 2-1 to 2-6 is hereinafter explained. The following explanation holds in case the conversion tables of Tables 1-1 to 1-6 are used subject to conversion table exchanges.

Referring to FIG. 1, digital data to be encoded are sequentially entered at a shift register 1 in synchronism with data clocks so that e.g., 9-bit data are stored in the shift register 1. Output data of the shift register 1 are supplied to an encoder 2 where the constraint length r and the table number are identified and the identified results and data are outputted to a selector 3.

To the selector 3 is entered a control signal specifying the leading end of data from a synchronization detection circuit 9 designed to detect the synchronization signal contained in the data. The input data are outputted to one of m-n conversion tables (1≦m≦9, 1≦n≦17) stored in the ROM 4.

The 1-1 conversion table is a table among the conversion tables of Tables 2-1 to 2-6 which is configured for converting 1-bit input data to a 1-bit codeword, while the 1-2 conversion table is a table among the conversion tables of Tables 2-1 to 2-6 which is configured for converting 1-bit input data to a 2-bit codeword. Similarly, the m-n conversion table is a table for converting m-bit input data into n-bit codeword. The Tables 2-1 to 2-6 above specify the m-n conversion tables as the destination of storage of the bit-based conversion tables.

In other words, the 1-1 conversion table up to the 9-17 conversion table have the conversion tables shown in Table 4. The table numbers in Tables 4 specify conversion tables of Tables 2-1 to 2-6.

TABLE 4

| Data | Code | Table Number |
|---|---|---|
| | 1-1 Conversion Table | |
| 1 | 0 | 1 |
| | 1-2 Conversion Table | |
| 1 | 00 | 2 |
| 1 | 00 | 3 |
| 1 | 00 | 4 |
| 1 | 00 | 5 |
| 1 | 00 | 6 |
| | 2-3 Conversion Table | |
| 01 | 0 10 | 1 |
| 01 | 01 0 | 6 |
| | 2-4 Conversion Table | |
| 01 | 01 00 | 2 |
| 01 | 01 00 | 3 |
| 01 | 01 00 | 4 |
| 01 | 01 00 | 5 |
| | 3-6 Conversion Table | |
| 001 | 01 00 10 | 2 |
| 001 | 01 00 10 | 3 |
| 001 | 01 00 10 | 4 |

TABLE 4-continued

| Data | Code | Table Number |
|---|---|---|
| | 4-7 Conversion Table | |
| 0010 | 0 10 00 10 | 1 |
| 0011 | 0 00 00 10 | 1 |
| 0011 | 01 00 1 00 | 5 |
| 0010 | 00 00 1 00 | 5 |
| 0011 | 01 0 00 10 | 6 |
| 0010 | 00 1 00 10 | 6 |
| | 4-8 Conversion Table | |
| 0001 | 01 00 00 10 | 2 |
| 0001 | 01 00 00 10 | 3 |
| | 5-9 Conversion Table | |
| 00011 | 0 10 00 00 10 | 1 |
| 00010 | 0 00 10 00 10 | 1 |
| 00011 | 01 00 00 1 00 | 4 |
| 00011 | 01 00 1 00 10 | 5 |
| 00010 | 01 00 0 00 10 | 5 |
| 00011 | 01 0 00 00 10 | 6 |
| | 5-10 Conversion Table | |
| 00001 | 01 00 00 00 10 | 2 |
| 00000 | 01 00 10 00 10 | 2 |
| | 6-11 Conversion Table | |
| 000011 | 0 10 00 00 00 10 | 1 |
| 000010 | 0 10 00 10 00 10 | 1 |
| 000001 | 0 00 10 00 00 10 | 1 |
| 000000 | 0 00 00 10 00 10 | 1 |
| 000011 | 01 00 10 00 1 00 | 3 |
| 000101 | 01 00 00 0 00 10 | 4 |
| 000100 | 01 00 10 0 00 10 | 4 |
| 000011 | 00 10 00 0 00 10 | 4 |
| 000010 | 00 00 10 0 00 10 | 4 |
| 000011 | 01 00 1 00 00 10 | 5 |
| 111111 | 00 00 1 00 00 10 | 5 |
| 000101 | 01 0 00 00 00 10 | 6 |
| 000100 | 01 0 00 10 00 10 | 6 |
| 000011 | 00 1 00 10 00 10 | 6 |
| 000010 | 00 1 00 00 00 10 | 6 |
| | 7-13 Conversion Table | |
| 1111111 | 01 00 00 10 00 1 00 | 2 |
| 0000101 | 01 00 00 00 0 00 10 | 3 |
| 0000100 | 01 00 10 00 0 00 10 | 3 |
| 0000011 | 00 10 00 00 0 00 10 | 3 |
| 0000010 | 00 10 00 00 0 00 10 | 3 |
| 1111111 | 01 00 00 10 0 00 10 | 3 |
| 0000011 | 01 00 00 1 00 00 10 | 4 |
| 0000010 | 00 10 00 1 00 00 10 | 4 |
| 0000101 | 01 00 1 00 00 00 10 | 5 |
| 0000100 | 01 00 0 00 00 00 10 | 5 |
| 0000011 | 01 00 1 00 10 00 10 | 5 |
| 0000010 | 00 10 0 00 00 00 10 | 5 |
| 0000011 | 01 0 00 00 00 00 10 | 6 |
| 0000010 | 01 0 00 10 00 00 10 | 6 |
| 0000001 | 01 0 00 00 10 00 10 | 6 |
| 0000000 | 00 1 00 10 00 00 10 | 6 |
| 1111111 | 00 1 00 00 00 00 10 | 6 |
| 1111110 | 00 1 00 00 10 00 10 | 6 |
| | 8-14 Conversion Table | |
| 11111111 | 0 10 00 00 10 00 1 00 | 1 |
| 11111110 | 0 00 10 00 10 00 1 00 | 1 |
| | 8-15 Conversion Table | |
| 00000011 | 01 00 10 00 1 00 00 10 | 3 |
| 00000010 | 01 00 00 00 1 00 00 10 | 3 |
| 00000001 | 00 00 10 00 1 00 00 10 | 3 |
| 00000011 | 01 00 00 0 00 00 00 10 | 4 |
| 00000010 | 01 00 10 0 00 00 00 10 | 4 |
| 00000001 | 01 00 00 0 00 00 00 10 | 4 |
| 00000000 | 00 10 00 0 00 00 00 10 | 4 |
| 00000011 | 01 00 1 00 00 00 00 10 | 5 |
| 00000010 | 01 00 0 00 00 00 00 10 | 5 |
| 00000001 | 00 00 1 00 00 00 00 10 | 5 |

TABLE 4-continued

| Data | Code | Table Number |
|---|---|---|
| 00000000 | 00 00 1 00 10 00 00 10 9-17 Conversion Table | 5 |
| 000000001 | 01 00 00 00 0 00 00 00 10 | 3 |
| 000000000 | 01 00 10 00 1 00 00 00 10 | 3 |

The codewords resulting from conversion in the m-n conversion table are outputted to a multiplexer 5 which then synthesizes codewords outputted from plural m-n conversion tables to output the resulting synthesized codewords to a buffer 6. The synthesized codewords, outputted from the buffer 6, are outputted to a data formatter 7 based upon channel clocks from a clock generator 8 generating channel clocks synchronized with data clocks. The data formatter 7 converts the synthesized codewords into recording codes for recording by e.g., non-return to zero inverted (NRZI). The recording codes are interleaved and error detection/ correction codes or synchronization signals are appended to the interleaved codes to coded data conforming to a pre-set format. The coded data are recorded on a disc 10 or optically recorded on a master. A stamper is fabricated from the master for mass-producing replica discs 10.

The operation of the above-described encoding device is explained.

First, the constraint length r and the table number are determined by the encoder 2 from 9-bit data stored in the shift register 1. The encoder 2 controls the selector 3 responsive to the results so that the selector outputs data to one of the m-n conversion tables of the ROM 4. If the constraint length r is determined to be 1, the data is supplied to the 1-1 conversion table or to the 1-2 conversion table for conversion to codes "0" or "00". To which of the 1-1 conversion table and the 1-2 conversion tables the data is to be fed is determined by the table number.

For the first input data, the table 1 having the number 1 is selected as the conversion table. If the data is "0011" and the constraint length is 4, conversion by the Table 4-1 stored in the 4-7 conversion table is carried out for converting the data to a code "0000010". The first input data means recording data directly after the start position as set by e.g. a synchronization signal. The remaining recording data (first data) are similarly converted by the conversion table associated with Table 2-1.

The conversion of the next input data is determined by the constraint length r of the data being converted and the current table number. That is, if (the table number $T_N$+constraint length r) is not more than 6 (=m), conversion occurs in accordance with the Table 2-($T_n$+r), whereas, if (the table number $T_N$+constraint length r) is 7 or more, conversion occurs in accordance with the Table 2-($T_n$+r−6). That is, if the constraint length r is 4 and the first input data is "00110011", the first 4 bits "0011" is converted to "0000010" bit by the Table 2-1 stored in the 4-7 conversion table, while the next four bits "0011" is converted by the Table 2-5 since $T_N$+r=4+1=5 (<6). Reference to Table 2-5 shows that the 4-7 conversion table provides the conversion for "0011", so that the next four bits "0011" is converted to a code "0100100". The two codes are synthesized by the multiplexer 5 so that the data word "00110011" is converted to a code "00000100100100".

The above-described coding is further explained in detail by referring to FIG. 2.

In this figure, if the input digital data is 18D2h in hexadecimal notation (FIG. 2A), its binary data becomes "0001100011010010" (FIG. 2B). The encoder 2 judges the constraint length r from the binary data as follows: Since the data is the first data, the table 2-1 is selected as the conversion table. As shown in Table 2-1, data "0", "00", "000" or "0001" are not provided in the Table 2-1. Thus the next data "00011" is first selected as the relevant bit string. Thus the encoder 2 judges the constraint length r to be 5. Thus the first five bits "00011" are converted by the conversion table of the Table 2-1 stored in the 5-9 conversion table to "010000010".

Since the constraint length r is 5, r+1=6, so that reference is had to Table 2-6 and the bit string "00011" is converted to "010000010" by the table stored in the 5-9 conversion table. This completes the conversion up to the tenth bit, that is, up to the fourth bit of the second 6-bit data in terms of the 6-bit string data as the conversion unit.

As may be seen from Table 2-6, once the data "00011" is converted into the codeword "010000010", the sequence or number of the table referred to next is Table 2-5, so that reference is had to Table 2-5 for converting the relevant bit sting "01" is converted to "0100" by the 2-4 conversion table. This completes conversion of the second 6-bit data string.

Referring to Table 2-5, once the data "01" is converted into the codeword "0100", the sequence or number of the table to be referred to next is Table 2-1. Thus, reference is had to Table 2-1, and the next bit string "0010" is converted by the 4-7 conversion table to "0100010". Thus a codeword "01000001001000001001000100010" as shown in FIG. 2c is formed. The synchronization codes or demarcation codes, specifying the demarcation of the above conversion, are appended to the codeword, as shown in FIG. 2d.

The codeword, thus generated by conversion, is routed to the buffer 6, where it is synchronized with channel clocks from the clock generator 8 shown in FIG. 2F, and thence supplied to the formatter 7. The formatter 7 generates, from the codeword, the NRZI recording signals, as shown in FIG. 2e, and records the NRZI recording signals on the disc 10.

Thus the digital data, having the start position as specified by the synchronization signal (SYNC signal), is encoded by accessing the m-n conversion tables in the ROM 4 based upon the constraint length r and the table number.

Referring to Table 5 and FIG. 3, the meritorious effect of the instant embodiment is explained.

Table 5 shows the minimum length between transitions Tmin (=(m/n)(d+1)T), maximum length between transitions Tmax (=(m/n)(k+1)T), window margin TW (=m/n) and the product of the minimum length between transitions Tmin and the window margin TW or Tmin*TW of the codeword of the instant embodiment (2, 17 RLL), where T denotes the clock interval for data to be modulated. For comparison, the corresponding values for the conventional (2,7 RLL) and EFM (eight-to-fourteen modulation) are also shown.

TABLE 5

| d,k code names | TW | Tmin | Tmax | Tmin*TW |
|---|---|---|---|---|
| 2,17 RLL | 0.55 | 1.64 | 9.93 | 0.893 |
| 2,15 RLL | 0.55 | 1.64 | 8.73 | 0.893 |
| 2, 7RLL (conventional) | 0.5 | 1.5 | 4.00 | 0.75 |
| EFM (conventional) | 0.47 | 1.41 | 5.28 | 0.664 |

It is seen from comparison of the values for the conventional (2,7 RLL) and EFM shown in Table 5 that the minimum length between transitions Tmin, window margin TW and the product of Tmin and TW (Tmin*TW), affecting the recording density, are larger than the values for the conventional (2,7 RLL) and EFM.

Specifically, the minimum length between transitions Tmin is 1.64/1.5 for (2.7 RLL), thus being larger by about 9.3%, while the window margin TW is 0.55/0.5 for (2.7 RLL) thus being larger by 10%. The product Tmin*TW for (2.7 RLL) is 0.893/0.75 thus being larger by 19%.

In particular, the window margin TW, equivalent to an eye-pattern customarily employed as an evaluation waveform for data detection, is higher by about 17% in the instant embodiment than with EFM for the same code recording density. That is, the data detection margin becomes wider so that data detection may be carried out more easily than conventionally even for the high density recording state.

It is also seen from FIG. 3 that MTF becomes smaller with increasing normalized spatial frequency (NA/λ). FIG. 3 shows the ranges of the normalized spatial frequency for the cases in which the code is recorded by the (2,17) encoding system of the instant embodiment and by the EFM system with the same recording density. It is seen that the normalized spatial frequency for EFM is extended in a range from 1.0 to 0.19, while that for (2,17 RLL) system is comprised in a range from 0.85 to 0.1. That is, the lower frequency suffices and hence a higher recording density may be achieved in the present embodiment.

Although the description of the instant embodiment is made with reference to an encoding device, the instant embodiment may be easily adapted for a decoding device.

That is, the decoding device shown in FIG. 4 reproduces data recorded by NRZI on the disc 10 as an information recording medium by a reproducing device 30 and outputs the reproduced output to a deformatter 31 and a reference clock generating circuit 32. The deformatter 31 processes the NRZI codes with deinterleaving or error detection/ correction and converts the processes codes into codewords. The reference clock generating circuit 32 detects clock bits recorded on the disc 10 and generates reference clocks by e.g., a PLL circuit.

The codewords outputted by the deformatter 31 are outputted at a conversion length judgment circuit 34 and a synchronization detection circuit 40. The conversion length judgment circuit 34 judges the conversion length and the table number. The synchronization detection circuit 40 detects the synchronization signals appended to the codes for identifying the demarcation points (FIG. 2D) for controlling the readout timing for the converted data from a ROM 36. The codewords outputted from the deformatter 31 are outputted via the conversion length decision circuit 34 to a selector 35. The codewords are decoded by the selector 35, ROM 36 and a multiplexor 37 so as to be outputted to a buffer 38.

The ROM 36 has stored therein substantially the same conversion tables as those stored in the ROM 4 shown in FIG. 1. That is, the ROM 36 has stored therein the 1-1 conversion table to the 9-17 conversion table shown in Tables 2-1 to 2-6 and 4-1 to 4-6 and converts the codes supplied from the selector 35 into data which are outputted to the multiplexed 37. Thus the ROM 36 performs the back conversion which is the reverse of the conversion performed by the ROM 4.

The buffer 38 outputs recorded data in synchronism with the reference clocks from a reference clock generating circuit 32.

The operation of the decoding device is hereinafter explained. The deformatter 31 processes data reproduced from the disc 10 with deinterleaving and error detection/ correction and outputs the resulting processed data to the conversion length decision circuit 34 and to the synchronization detection circuit 40. The synchronization detection circuit 40 detects synchronization signals (demarcation signals) inserted between neighboring codewords contained in the input codeword (FIG. 2D, such as X position). The conversion length decision circuit 34 determines the conversion length of the codes (codeword length) based upon the synchronization signals (demarcation signals) detected by the synchronization detection circuit 40. The conversion length decision circuit 34 determines the sequence of the conversion tables as in the case of the encoder 2 of FIG. 1 for judging the conversion table number for each codeword based upon the determined sequence and outputs the codeword and the table number to the selector 35.

The selector 35 outputs the input codeword to the conversion table having the relevant conversion length and table number.

If, for example, the input codeword is "010000010010000010010000100010", the first code "010000010" is extracted in dependence upon the demarcation signal. Since the 9-bit codeword is the first codeword, it is furnished to the 5-9 conversion table of the conversion table of the table number 1 so as to be converted into data "00011".

The table selected next is the Table 2-6, as indicated in Table 2-1. Thus the code "010000010" extracted in dependence upon the next demarcation signal is converted into data "00011" in accordance with Table 2-6.

Table 2-5 is then selected in accordance with Table 2-6, so that the next codeword "0100" is converted into data "01" in accordance with Table 2-5.

Table 2-1 is then selected as the next table in accordance with Table 2-5. In Table 2-1, the next codeword "0100010" is converted into data "0010".

The data converted in this manner in the respective conversion tables are synthesized by the multiplexed 37 to a data "0001100011010010" which is outputted via the buffer 38 to a downstream side circuit, not shown.

In this manner, the codeword suited to high density recording can be decoded easily.

Tables 6 and 7 show other embodiments of the conversion tables.

TABLE 6

TABLE 6-1

| Data | 1 2 3 4 5 1 2 3 4<br>Codewords |
|---|---|
| 11 | 000 |
| 10 | 100 |
| 011 | 010 00 |
| 010 | 001 00 |
| 0011 | 000 10 00 |
| 0010 | 100 10 00 |
| 0001 | 010 01 00 |
| 000011 | 001 00 10 01 00 |
| 000010 | 010 00 10 01 00 |
| 00000111 | 010 00 00 10 01 000 |
| 00000110 | 010 00 00 10 01 000 |
| 00000101 | 001 00 00 10 01 000 |
| 00000100 | 100 00 00 10 01 001 00 |
| 000000111 | 100 00 00 00 01 001 00 |
| 000000110 | 010 01 00 00 01 001 00 |
| 000000101 | 010 00 10 00 01 001 00 |

TABLE 6-1-continued

| Data | 1 2 3 4 5 1 2 3 4<br>Codewords |
|---|---|
| 000000100 | 010 00 10 00 01 001 00 |
| 000000011 | 010 00 00 00 01 001 00 |
| 000000010 | 001 00 10 00 01 001 00 |
| 000000001 | 001 00 01 00 01 001 00 |
| 000000000 | 001 00 00 00 01 001 00 |
| *1111110011 | 010 00 00 10 01 000 10 00 |

TABLE 6-2

| Data | 2 3 4 5 1 2 3 4<br>Codewords |
|---|---|
| 1 | 00 |
| 01 | 01 00 |
| 001 | 10 01 00 |
| 0001 | 00 10 01 00 |
| 000011 | 10 00 10 01 000 |
| *111111 | 01 00 10 01 000 |
| 0000101 | 10 00 00 01 001 00 |
| 0000100 | 01 00 00 01 001 00 |
| 0000011 | 00 10 00 01 001 00 |
| 0000010 | 00 01 00 01 001 00 |
| 0000001 | 10 01 00 01 001 00 |
| 00000001 | 10 00 10 01 000 10 00 |
| 00000000 | 01 00 10 01 000 10 00 |

TABLE 6-3

| Data | 3 4 5<br>Codewords |
|---|---|
| 1 | 00 |
| 01 | 10 00 |
| 00 | 01 00 |

TABLE 6-4

| Data | 4 5 1 2 3 4 5 6<br>Codewords |
|---|---|
| 1 | 00 |
| 01 | 10 00 |
| 00 | 01 00 |
| *11111 | 10 01 001 00 |
| *01111111 | 10 01 001 00 10 01 00 |

TABLE 6-5

| Data | 5 1 2 3 4 5 1 2 3 4<br>Codewords |
|---|---|
| 1 | 00 |
| 011 | 10 000 |
| 010 | 01 000 |
| 0011 | 10 010 00 |
| 0010 | 10 001 00 |
| 00011 | 10 010 01 00 |
| 00010 | 10 000 10 00 |
| 00001 | 01 000 10 00 |
| 0000011 | 10 010 00 10 01 00 |
| 0000010 | 10 001 00 10 01 00 |
| *1111111 | 01 001 00 10 01 00 |
| 000000111 | 10 010 00 00 10 01 000 |
| 000000110 | 10 001 00 00 10 01 000 |
| 000000101 | 10 010 01 00 10 01 000 |
| 000000100 | 01 001 00 00 10 01 000 |
| 000000011 | 10 000 00 00 10 01 000 |

TABLE 6-5-continued

| Data | 5 1 2 3 4 5 1 2 3 4<br>Codewords |
|---|---|
| 000000010 | 01 000 00 00 10 01 000 |
| 0000000011 | 10 010 00 00 00 01 001 00 |
| 0000000010 | 10 001 00 00 00 01 001 00 |
| 0000000001 | 10 010 01 00 00 01 001 00 |
| 00000000001 | 10 010 00 00 10 01 000 10 00 |
| 00000000000 | 10 001 00 00 10 01 000 10 00 |

TABLE 7

TABLE 7-1

| Data | 1 2 3 4 5 1 2 3 1<br>Codewords |
|---|---|
| 11 | 000 |
| 10 | 100 |
| 011 | 010 00 |
| 010 | 001 00 |
| 0011 | 010 01 00 |
| 0010 | 000 10 00 |
| 0001 | 100 10 00 |
| 000011 | 010 00 10 01 00 |
| 000010 | 001 00 10 01 00 |
| 00000111 | 100 00 00 10 01 000 |
| 00000110 | 010 00 00 10 01 000 |
| 00000101 | 010 01 00 10 01 000 |
| 00000100 | 001 00 00 10 01 000 |
| 000000111 | 100 00 00 00 01 001 00 |
| 000000110 | 010 00 00 00 01 001 00 |
| 000000101 | 001 00 10 00 01 001 00 |
| 000000100 | 001 00 01 00 01 001 00 |
| 000000011 | 010 01 0 00 01 001 00 |
| 000000010 | 010 00 10 00 01 001 00 |
| 000000001 | 010 00 01 00 01 001 00 |
| 000000000 | 001 00 00 00 01 001 00 |
| *1111110010 | 010 00 00 10 01 000 10 00 |

TABLE 7-2

| Data | 2 3 4 5 1 2 3 4<br>Codewords |
|---|---|
| 1 | 00 |
| 01 | 01 00 |
| 001 | 10 01 00 |
| 0001 | 00 10 01 00 |
| 000011 | 10 00 10 01 000 |
| *111111 | 01 00 10 01 000 |
| 0000101 | 10 00 00 01 001 00 |
| 0000100 | 10 01 00 01 001 00 |
| 0000011 | 01 00 00 01 001 00 |
| 0000010 | 00 10 00 01 001 00 |
| 0000001 | 00 01 00 01 001 00 |
| 00000001 | 10 00 10 01 000 10 00 |
| 00000000 | 01 00 10 01 000 10 00 |

TABLE 7-3

| Data | 3 4 5<br>Codeword |
|---|---|
| 1 | 00 |
| 01 | 10 00 |
| 00 | 01 00 |

TABLE 7-4

| Data | 4 5 1 2 3 4 5 1<br>Codewords |
|---|---|
| 1 | 00 |
| 01 | 10 00 |
| 00 | 01 00 |
| *11111 | 10 01 001 00 |
| *01111111 | 10 01 001 00 10 01 00 |

TABLE 7-5

| Data | 5 1 2 3 4 5 1 2 3<br>Codewords |
|---|---|
| 1 | 00 |
| 011 | 10 000 |
| 010 | 01 000 |
| 0011 | 10 010 00 |
| 0010 | 10 001 00 |
| 00011 | 10 010 01 00 |
| 00010 | 10 000 10 00 |
| 00001 | 01 000 10 00 |
| *1111111 | 01 001 00 10 01 00 |
| 0000011 | 10 010 00 10 01 00 |
| 0000010 | 10 001 00 10 01 00 |
| 000000111 | 01 001 00 00 10 01 000 |
| 000000110 | 10 010 00 00 10 01 000 |
| 000000101 | 10 010 01 00 10 01 000 |
| 000000100 | 10 001 00 00 10 01 000 |
| 000000011 | 10 000 00 00 10 01 000 |
| 000000010 | 01 000 00 00 10 01 000 |
| 0000000011 | 10 010 01 00 00 01 001 00 |
| 0000000010 | 10 010 00 10 00 01 001 00 |
| 0000000001 | 10 010 00 01 00 01 001 00 |
| 0000000000 | 10 001 00 00 00 01 001 00 |
| *0111111001 | 10 001 00 10 00 01 001 00 |

Tables 6 and 7 represent modified embodiments of the conversion tables. In these embodiments, the conversion tables are constituted by respective five tables. In the present embodiments, data "1" converted into a codeword "00", while data "11" is converted into a codeword "000". That is, while encoding is performed on the bit basis in the embodiments shown in Tables 1 and 2, encoding is performed in the present embodiment on the two-bit basis.

In the embodiments of Tables 6 and 7, if five or more of "1" of digital data appear consecutively, such code string is converted at a pre-set interval into a codeword containing the logical "1", in order to inhibit continuation "0" s in the codestring. Specifically, should the leading bit or leading two bits of a data word to be converted be pre-set bits, it is judged whether or not 4 or more bits of logical "1" appear consecutively in the next following data word string. The conversion operation is controlled so that, if 4 or more bits appear consecutively, the conversion operation performed is that specified by the mark *.

In any of these embodiments, the values of m,n;r of the conversion tables are set so as to be the same or different from one table to another. However, the value of d in the codestring is set so as to be constant. The values of m and n in the ultimate codestring are 6 and 11, respectively, while the value of k in the codestring is 15 in both of the embodiments of Tables 6 and 7.

If data converted into the codeword is directly recorded and reproduced using plural conversion tables, dc components are occasionally produced. It is possible to append merging bits for decreasing the dc component at arbitrary positions among the positions corresponding to the demarcation signals shown in FIG. 2. To this end, a merging bit appending circuit 21 may be provided in the encoding device as shown in FIG. 1.

The merging bit appending circuit 21 is fed with the demarcation signals (synchronization signals) from the encoder 2, while being also fed from the multiplexer 5 with synthesized codewords supplied from the conversion tables. The dc components of the supplied codestring are calculated and merging bits which will decrease the dc components are found. The merging bits 0 or 1 are appended at positions corresponding to the pre-set synchronization signals and the codestring having the merging bits appended thereto is returned to the multiplexer 5.

The merging bit appending circuit 21 appends "0" and "1" as merging bits for decreasing and increasing the dc components, respectively.

Such control of the dc components is known as digital sum value (DSV) control. That is, in the DSV control, the codes "0" and "1" are respectively set to "−1" and "1" and the sum of the resulting codestring is calculated. The merging bits are determined so that the value of the sum will be closer to zero.

The merging bits may be determined by adding the DSV prevailing before code insertion to the DSV after code insertion and by selecting such a code which will diminish the absolute sum value.

In this manner, the interval of the insertion of the merging bits is inversely proportional to the low-range cut-off frequency of the codestring. The interval of insertion of the merging bits is explained in detail in U.S. Ser. No. 08/147, 836 and in corresponding JP Patent Kokai Publication JP-A-HEI 06-197,024 (date of Kokai publication, Jul. 15, 1994).

The merging bit inserting interval in a continuous codestring is an integer number multiple of 11. For example, if the interval between the 11th and 12th bits is the initial merging bit inserting position, the interval between the 22nd and 23rd bits and the interval between the 33rd and 34th bits represent the merging bit inserting positions.

If the merging bit inserting interval is the interval between a position corresponding to an integer number multiple of 44 and the next adjacent code, the conversion code is 44+1 for the 24 information bits, such that the conversion ratio between the information bits and the conversion codes is 24:45=8:15.

Figure 5A:
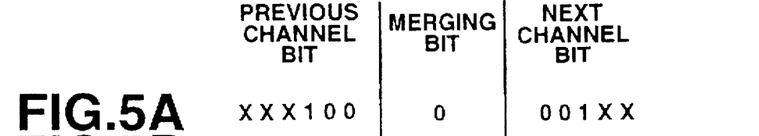
FIGS. 5A, 5B, 5C, 5D, 5E, 5F, 5G, 5H, 5I and 5J illustrate merging bits.
Figure 5B:
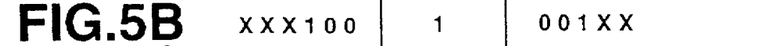

For example, if the previous channel bit is "XXX100" and the next channel bit is "001XX", merging bits "0" or "1" are inserted between the channel bits (FIGS. 5A and 5B).

Figure 5C:
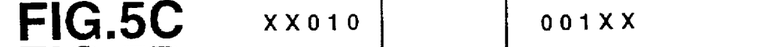
Figures 5D, 5E:
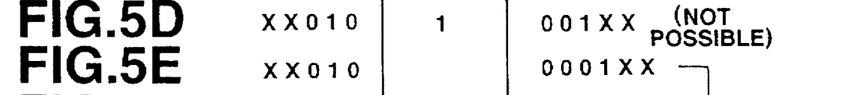

However, if the previous channel bits are "XX010" and the next channel bits are "001XX", as shown in FIG. 5C, and if the merging bit "1" is appended for d=2 as shown in FIG. 5D, the principle of the value of d being 2 is collapsed. That is, the rule stating that at least two "0"s be inserted between "1" and the next "1" is violated by appending the merging bit as indicated in FIG. 5D.

Figure 5F:
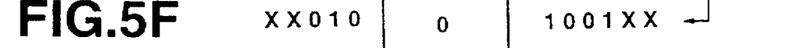

If the previous channel bits are "XX010"and the next channel bits are "0001XX", as shown in FIG. 5E, and the merging bit "1" is to be appended, encoding is made as shown in FIG. 5F. That is, the previous channel bits "XX010" are left as they are and the merging bit "0" is appended. The leading bit of the next channel bits is changed from "0" to "1" so that the next channel bits become "100XX".

Figure 5G:
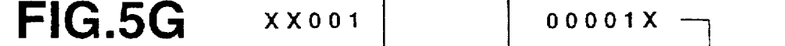
Figure 5H:
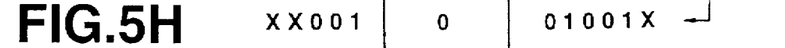

If, as shown in FIG. 5G, the previous channel bits are "XX001", the next channel bits are "00001X" and the merging bit "1" needs to be appended, the previous channel bits "XX001" are left and the merging bit "0" is appended, as shown in FIG. 5H. The second bit of the next channel bits are changed from "0" to "1" so that the next channel bits become "01001X".

This satisfies the rule d=2. The value of k is increased to 16 as a result of appendage of the merging bit in the embodiment of Table 6. However, the value of k may remain to be 15 in the embodiment of table 7.

The merging bit inserting interval is not limited to integer multiples of 11 or 44. That is, the merging bits may be inserted at an interval corresponding to integer number multiples of an arbitrary number of bits. However, in this case, the k parameter in the embodiment of Table 8 is increased such that (d,k;m,n)=(2,16;6,11).

Figure 5I:
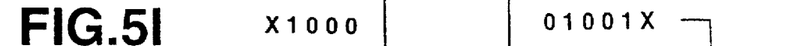
Figure 5J:
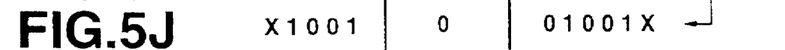

If part of the channel bits is to be inverted during merging bit insertion, which of the channel bit previous to the merging bit inserting position or the next channel bit is to be changed needs to be determined previously. The reason is that, if the previous channel bits are "X1000", the next channel bits are "0100X" and the merging bit "1" is to be appended, as shown in FIG. 5I, monistic demodulation can not necessarily be achieved unless it is previously determined which of the channel bits is to be changed. That is, if, in the example of FIG. 5I, the last bit of the previous channel bits is inverted as shown in FIG. 5J, the codestring produced on decoding becomes indistinguishable from the codestring shown in FIG. 5H. If the next channel bit is to be changed, "1" cannot be selected as the merging bit, so that there is no alternative but to insert "0" because the insertion of "1" in the bit string of FIG. 5I is not in meeting with d=2 rule.

Figure 6:
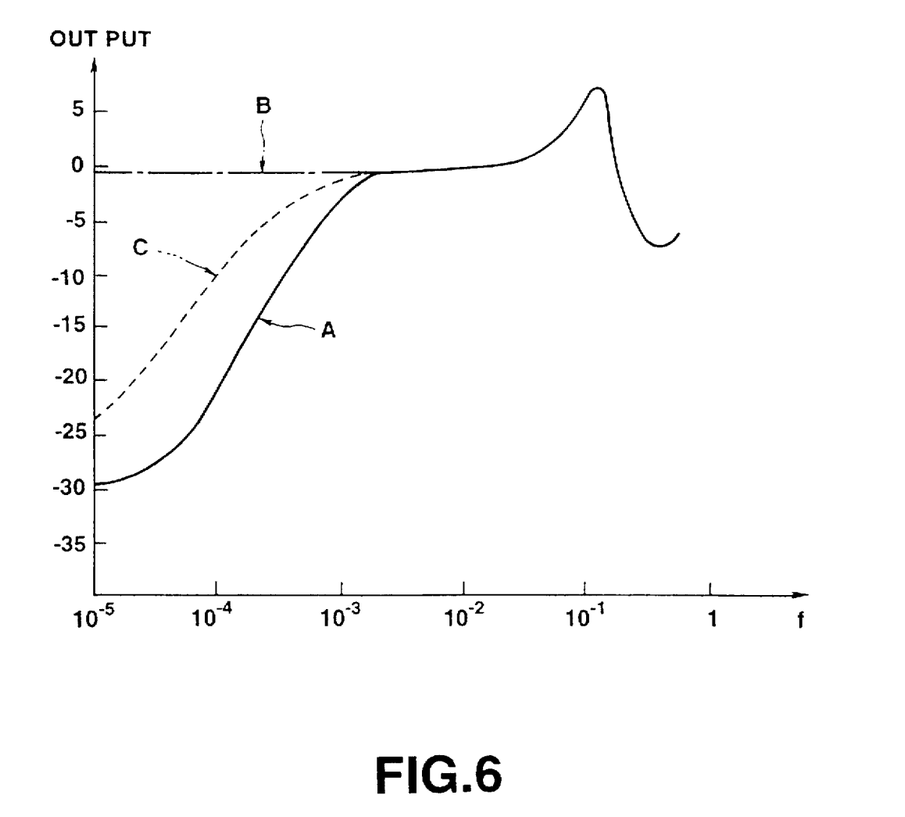
FIG. 6 illustrates the effect of the merging bits.

If the merging bits are appended in this manner for adjusting the dc components, the output level (dB) in the low frequency range may be lowered as indicated by a curve A in FIG. 9 as compared to a curve B for the case of not appending the merging bits. This enables recording at a correspondingly high density. In FIG. 6, a curve C stands for characteristics in case the 8-15 converted codes are controlled by DSV control. It is seen that the curve A in the above embodiment has a lower output level in the low frequency range.

In FIG. 6, the ordinate stands for an output in dB and the abscissa the relative frequency with the channel clock frequency set to unity (1). The actual frequency is the channel clock frequency multiplied by the coefficient of FIG. 6.

Tables 8 to 10 represent embodiments of further conversion tables. In these embodiments, five sorts of the conversion tables 1 to 5 are used in this sequence for encoding and decoding.

As for parameters, (d,k;m,n)=(2,14;6,11), (d,k;m,n)=(2,16;6,11) and (d,k;m,n)=(2,18;6,11) for the embodiments of Tables 8, 9 and 10, respectively. In these embodiments, the rules of d=2 (m,n)=(6,11) are met.

TABLE 8-1

| Data | 1 2 3 4 5 1 2 3 4<br>Codewords |
|---|---|
| 11 | 000 |
| 10 | 100 |
| 011 | 010 00 |
| 010 | 001 00 |
| 0011 | 100 10 00 |
| 0010 | 010 01 00 |
| 0001 | 000 10 00 |
| 000011 | 010 00 10 01 00 |
| 000010 | 001 00 10 01 00 |

TABLE 8-1-continued

| Data | 1 2 3 4 5 1 2 3 4<br>Codewords |
|---|---|
| 00000111 | 100 00 00 10 01 000 |
| 00000110 | 001 00 00 10 01 000 |
| 00000101 | 010 01 00 10 01 000 |
| 00000100 | 010 00 00 10 01 000 |
| *111111010 | 100 00 00 00 01 001 00 |
| *111111000 | 001 00 10 00 01 001 00 |
| 000000111 | 010 00 00 00 01 001 00 |
| 000000110 | 010 00 01 00 01 001 00 |
| 000000101 | 010 00 10 00 01 001 00 |
| 000000100 | 001 00 00 00 01 001 00 |
| 000000011 | 010 01 00 00 01 001 00 |
| 000000010 | 001 00 01 00 01 001 00 |
| 000000001 | 100 00 00 10 01 000 10 00 |
| 0000000010 | 010 00 00 10 01 000 10 00 |
| 0000000001 | 010 01 00 10 01 000 10 00 |
| 0000000000 | 001 00 00 10 01 000 10 00 |

TABLE 8-2

| Data | 2 3 4 5 1 2 3 4<br>Codewords |
|---|---|
| 1 | 00 |
| 01 | 01 00 |
| 001 | 10 01 00 |
| 0001 | 00 10 01 00 |
| 000011 | 01 00 10 01 000 |
| 000010 | 10 00 10 01 000 |
| *1111111 | 10 00 00 01 001 00 |
| *1111110 | 00 01 00 01 001 00 |
| 0000011 | 01 00 00 01 001 00 |
| 0000010 | 10 01 00 01 001 00 |
| 0000001 | 00 10 00 01 001 00 |
| 00000001 | 01 00 10 01 000 10 00 |
| 00000000 | 10 00 10 01 000 10 00 |

TABLE 8-3

| Data | 3 4 5<br>Codeword |
|---|---|
| 1 | 00 |
| 01 | 10 00 |
| 00 | 01 00 |

TABLE 8-4

| Data | 4 5 1 2 3 4 5 6<br>Codeword |
|---|---|
| 1 | 00 |
| 01 | 10 00 |
| 00 | 01 00 |
| *11111 | 10 01 001 00 |
| *01111111 | 10 01 001 00 10 01 00 |

TABLE 8-5

| Data | 5 1 2 3 4 5 1 2 3 4<br>Codewords |
|---|---|
| 1 | 00 |
| 011 | 10 000 |
| 010 | 01 000 |
| 0011 | 10 001 00 |
| 0010 | 10 001 00 |
| 00011 | 01 000 10 00 |

TABLE 8-5-continued

| Data | 5 1 2 3 4 5 1 2 3 4<br>Codewords |
|---|---|
| 00010 | 10 010 01 00 |
| 00001 | 10 000 10 00 |
| *1111111 | 01 001 00 10 01 00 |
| 0000011 | 10 010 00 10 01 00 |
| 0000010 | 10 001 00 10 01 00 |
| *111111010 | 01 000 00 00 10 01 000 |
| 000000111 | 10 000 00 00 10 01 000 |
| 000000110 | 10 001 00 00 10 01 000 |
| 000000101 | 10 010 01 00 10 01 000 |
| 000000100 | 10 010 00 00 10 01 000 |
| *1111110001 | 01 000 00 00 00 01 001 00 |
| *1111110000 | 10 000 00 00 00 01 001 00 |
| *0111111000 | 10 001 00 10 00 01 001 00 |
| 0000000111 | 10 010 00 00 00 01 001 00 |
| 0000000110 | 10 010 00 01 00 01 001 00 |
| 0000000101 | 10 010 00 10 00 01 001 00 |
| 0000000100 | 10 001 00 00 00 01 001 00 |
| 0000000011 | 10 010 01 00 00 01 001 00 |
| 0000000010 | 10 001 00 01 00 01 001 00 |
| 00000000011 | 10 000 00 00 10 01 000 10 00 |
| 00000000010 | 10 010 00 00 10 01 000 10 00 |
| 00000000001 | 10 010 01 00 10 01 000 10 00 |
| 00000000000 | 10 001 00 00 10 01 000 10 00 |

TABLE 9-1

| Data | 1 2 3 4 5 1 2 3<br>Codewords |
|---|---|
| 11 | 000 |
| 10 | 100 |
| 011 | 010 00 |
| 010 | 001 00 |
| 0011 | 000 10 00 |
| 0010 | 010 10 00 |
| 0001 | 010 01 00 |
| 000011 | 001 00 10 01 |
| 000010 | 010 00 10 01 00 |
| 00000111 | 010 00 00 10 01 000 |
| 00000110 | 010 01 00 10 01 000 |
| 00000101 | 001 00 00 10 01 000 |
| 00000100 | 100 00 00 10 01 000 |
| 000000111 | 100 00 00 00 01 001 00 |
| 000000110 | 010 01 00 00 01 001 00 |
| 000000101 | 010 00 10 00 01 001 00 |
| 000000100 | 010 00 01 00 01 001 00 |
| 000000011 | 010 00 00 00 01 001 00 |
| 000000010 | 001 00 10 00 01 001 00 |
| 000000001 | 001 00 01 00 01 001 00 |
| 000000000 | 001 00 00 00 01 001 00 |

TABLE 9-2

| Data | 2 3 4 5 1 2 3 4<br>Codeword |
|---|---|
| 1 | 00 |
| 01 | 01 00 |
| 001 | 10 01 00 |
| 0001 | 00 10 01 00 |
| 000011 | 10 00 10 01 000 |
| *111111 | 01 00 00 10 001 00 |
| 0000101 | 10 00 00 01 001 00 |
| 0000100 | 01 00 00 01 001 00 |
| 0000011 | 00 10 00 01 001 00 |
| 0000010 | 00 01 00 01 001 00 |
| 0000001 | 10 01 00 01 001 00 |
| 00000001 | 10 00 10 01 000 10 00 |
| 00000000 | 01 00 10 01 000 10 00 |

TABLE 9-3

| Data | 3 4 5<br>Codewords |
|---|---|
| 1 | 00 |
| 01 | 10 00 |
| 00 | 01 00 |

TABLE 9-4

| Data | 4 5 1 2 3 4 5 1<br>Codewords |
|---|---|
| 1 | 00 |
| 01 | 10 00 |
| 00 | 01 00 |
| *11111 | 10 01 001 00 |
| *00111111 | 10 01 001 00 10 01 00 |

TABLE 9-5

| Data | 5 1 2 3 4 5 1 2 3<br>Codewords |
|---|---|
| 1 | 00 |
| 011 | 10 000 |
| 010 | 01 000 |
| 0011 | 10 010 00 |
| 0010 | 10 001 00 |
| 00011 | 10 010 01 00 |
| 00010 | 10 000 10 00 |
| 00001 | 01 000 10 00 |
| 0000011 | 10 010 00 10 01 00 |
| 0000010 | 10 001 00 10 01 00 |
| 0000001 | 01 001 00 10 01 00 |
| 000000011 | 10 010 00 00 10 01 000 |
| 000000010 | 10 001 00 00 10 01 000 |
| 000000001 | 10 010 01 00 10 01 000 |
| 000000000 | 01 001 00 00 10 01 000 |
| *111111111 | 10 000 00 00 10 01 000 |
| *111111100 | 01 000 00 00 10 01 000 |
| *1111111011 | 10 010 00 00 00 01 001 00 |
| *1111111010 | 10 001 00 00 00 01 001 00 |

TABLE 10-1

| Data | 1 2 3 4 5 1 2 3<br>Codewords |
|---|---|
| 11 | 000 |
| 10 | 100 |
| 011 | 010 00 |
| 010 | 001 00 |
| 0011 | 000 10 00 |
| 0010 | 100 10 00 |
| 0001 | 010 01 00 |
| 000011 | 001 00 10 01 00 |
| 000010 | 010 00 10 01 00 |
| 00000111 | 010 00 00 10 01 000 |
| 00000110 | 010 01 00 10 01 000 |
| 00000101 | 001 00 00 10 01 000 |
| 00000100 | 100 00 00 10 01 000 |
| 000000111 | 100 00 00 00 01 001 00 |
| 000000110 | 010 01 00 00 01 001 00 |
| 000000101 | 010 00 10 00 01 001 00 |
| 000000100 | 010 00 01 00 01 001 00 |
| 000000011 | 010 00 00 00 01 001 00 |
| 000000010 | 001 00 10 00 01 001 00 |
| 000000001 | 001 00 01 00 01 001 00 |
| 000000000 | 001 00 00 00 01 001 00 |

TABLE 10-2

| Data | 2 3 4 5 1 2 3 4 Codewords |
|---|---|
| 1 | 00 |
| 01 | 01 00 |
| 001 | 10 01 00 |
| 0001 | 00 10 01 00 |
| 000011 | 10 00 10 01 000 |
| *111111 | 01 00 10 01 000 |
| 0000101 | 10 00 00 01 001 00 |
| 0000100 | 01 00 00 01 001 00 |
| 0000011 | 00 10 00 01 001 00 |
| 0000010 | 00 01 00 01 001 00 |
| 0000001 | 10 01 00 01 001 00 |
| 00000001 | 10 00 10 01 000 01 00 |
| 00000000 | 01 00 10 01 000 10 00 |

TABLE 10-3

| Data | 3 4 5 Codewords |
|---|---|
| 1 | 00 |
| 01 | 10 00 |
| 00 | 01 00 |

TABLE 10-4

| Data | 4 5 1 2 3 4 5 1 Codewords |
|---|---|
| 1 | 00 |
| 01 | 10 00 |
| 00 | 01 00 |
| *11111 | 10 01 001 00 |
| *00111111 | 10 01 001 00 10 01 00 |

TABLE 10-5

| Data | 5 1 2 3 4 5 1 2 Codewords |
|---|---|
| 1 | 00 |
| 011 | 10 000 |
| 010 | 01 000 |
| 0011 | 10 010 00 |
| 0010 | 10 001 00 |
| 00011 | 10 010 01 00 |
| 00010 | 10 000 10 00 |
| 00001 | 01 000 10 00 |
| 0000011 | 10 010 00 10 01 00 |
| 0000010 | 10 001 00 10 01 00 |
| 0000001 | 01 001 00 10 01 00 |
| 000000011 | 10 010 00 00 10 01 000 |
| 000000010 | 10 001 00 00 10 01 000 |
| 000000001 | 10 010 01 00 10 01 000 |
| 000000000 | 01 001 00 00 10 01 000 |
| *111111111 | 10 000 00 00 10 01 000 |
| *111111100 | 01 000 00 00 10 01 000 |

It will be apparent from the foregoing that, with the data encoding method according to the present invention, a data word string in terms of (m i) bits as a unit are converted into a codeword string in terms of (n i) bits as a unit. The data word string in terms of (m i) bits as a unit is received and the constraint length specifying the length of the data word now to be converted is judged, while it is also judged to which one of the m bits responds the leading bit of the data word now to be converted. Depending on the constraint length and the above results of judgment, one of plural conversion tables satisfying at least the minimum run length d and constituting the variable length tables is selected and, depending on the selected conversion table, the codeword corresponding to the data word now to be converted is generated for increasing the product of the minimum length between transitions and the window margin for enabling high density data recording on the information recording medium.

Also, with the data decoding method according to the present invention, a codeword string in terms of (n i) bits as a unit are converted into a data word string in terms of (m i) bits as a unit. The data word string in terms of (n i) bits as a unit is received and the conversion length specifying the length of the codeword now to be converted is judged, while it is also judged to which one of the m bits corresponds the trailing bit of the data word already obtained. Depending on the conversion length and the above results of judgment, one of plural conversion tables each representing the variable length table is selected and, depending on the selected conversion table, the data word corresponding to the codeword now to be converted is generated for enabling accurate decoding of codes recorded to a high density on the information recording medium.

What is claimed is:

1. A data encoding method for converting an m bit data word into an n bit based codeword, where m and n are numbers with n>m, said method comprising:

a step of receiving an m bit data word;

a step of determining a constraint length specifying a length of a data word which is to be converted and which is a constituent of the m bit data word;

a step of finding a bit of said m bit data word, which is a leading end bit of the data word;

a step of selecting one of a plurality of conversion tables based on the constraint length and the end bit, said conversion tables comprised of variable length tables at least satisfying a minimum run length d; and a step of generating a codeword corresponding to the data word, in accordance with the selected conversion table.

2. The data encoding method as claimed in claim 1 wherein said conversion tables are comprised of tables having different values of a conversion ratio.

3. The data encoding method as claimed in claim 2 wherein said conversion tables are comprised of tables having values of the conversion ratio which is different from n/m.

4. The data encoding method as claimed in claim 1 wherein said conversion tables prohibit the maximum run length from becoming ∞.

5. The data encoding method as claimed in claim 1 wherein said conversion tables are comprised of tables for allocating another code word in substitution for a code corresponding to a combination of pre-set data words if a run-length of the code string corresponding to the combination of the pre-set data words exceeds a maximum run-length.

6. The data encoding method as claimed in claim 1 wherein said conversion tables are comprised of tables for converting a data word of a unit larger than a data unit of said m bits into a codeword of a unit larger than a code unit of said n bits.

7. The data encoding method as claimed in claim 1 wherein d is 2.

8. The data encoding method as claimed in claim 7 wherein a maximum run-length k is 18 or less.

9. The data encoding method as claimed in claim 7 wherein m and n are 6 and 11, respectively.

10. The data encoding method as claimed in claim 9 wherein a minimum length between transitions in of said code is (18/11)T.

11. The data encoding method as claimed in claim 8 wherein a maximum run-length k is 17 and wherein the maximum length between transitions is (6/11) 18T.

12. The data encoding method as claimed in claim 8 wherein the maximum run-length k is 15 and wherein the maximum length between transitions of said codeword is (6/11) 16T.

13. The data encoding method as claimed in claim 1 wherein if, the data word to be converted is "1" or "11", said codeword is set to "0" or "00", respectively.

14. The data encoding method as claimed in claim 1 further comprising a step of inserting a merging bit for decreasing dc components of said codeword string converted from said data word string at a pre-set interval.

15. The data encoding method as claimed in claim 14 wherein, if insertion of said merging bit into said codeword string leads to violation of a minimum run-length rule, a channel bit in said codeword string before or after the position of insertion of said merging bit is inverted in said sixth step for satisfying the minimum run-length rule.

16. The data encoding method as claimed in claim 15 wherein the code of which the channel bit is to be inverted is pre-set.

17. A data encoding method for converting an n bit code into an m bit data word, where m, n are numbers, with n>m, comprising:

a step of receiving said n bit code;

a step of finding a conversion length of a codeword which is to be converted;

a step of finding on which bit number of the m bits, falls the trailing end bit of the data word;

a step of selecting one of a plurality of conversion tables comprising variable length tables in accordance with the conversion length and the trailing bit;

a step of generating a data word associated with the codeword, in accordance with the selected conversion table; wherein said code satisfies at least the rule of the minimum run-length d.

18. The data decoding method as claimed in claim 17 wherein said conversion tables are comprised of tables having different values in the conversion tables.

19. The data decoding method as claimed in claim 18 wherein said conversion tables are comprised of tables having values of a conversion ratio different from n/m.

20. The data decoding method as claimed in claim 17 wherein said conversion tables are comprised of tables designed to prohibit the maximum run-length from becoming ∞.

21. The data decoding method as claimed in claim 17 wherein said conversion tables are comprised of tables for allocating another codeword in substitution for a codeword string corresponding to a combination of pre-set data words if a run length of the code corresponding to the combination of the pre-set data words exceeds a maximum run-length k.

22. The data decoding method as claimed in claim 17 wherein said conversion tables are comprised of tables for converting a codeword of a unit larger than a code unit of said n bits into a data word of a unit larger than a data unit of said m bits.

23. The data decoding method as claimed in claim 17 wherein d is 2.

24. The data decoding method as claimed in claim 23 wherein the maximum run-length k in said code is 18.

25. The data decoding method as claimed in claim 23 wherein m and n are 6 and 11, respectively and wherein the window margin Tw of said codeword is (6/11)T, where T is the time interval of said data word string.

26. The data decoding method as claimed in claim 25 wherein the minimum length between transitions Tmin of said codeword is (18/11)T.

27. The data decoding method as claimed in claim 24 wherein the maximum run-length k is 17 and wherein the maximum length between transitions Tmax is (6/11) 18T.

28. The data decoding method as claimed in claim 24 wherein the maximum run-length k is 15 and wherein the maximum length between transitions Tmax of said codeword is (6/11) 16T.

29. The data decoding method as claimed in claim 17 wherein if, the codeword to be converted is "0" or "00", said data word is set to "1" and if the codeword to be converted is "000", said data word is set to "1".

30. The data decoding method as claimed in claim 17 further comprising a step of removing a merging bit, inserted into said codeword string at a pre-set interval for decreasing dc components of said code.

31. The data decoding method as claimed in claim 30 wherein, if removal of said merging bit from said code leads to violation of the minimum run-length rule, a channel bit in said codeword string before or after a position of insertion of said merging bit is inverted for satisfying a minimum run-length rule for controlling the codeword string.

32. The data decoding method as claimed in claim 31 wherein the code of which the channel bit is to be inverted is pre-set in said sixth step.

* * * * *